United States Patent
Suzuki et al.

(10) Patent No.: US 12,359,308 B2
(45) Date of Patent: Jul. 15, 2025

(54) FILM FORMING METHOD AND SEMICONDUCTOR PRODUCTION APPARATUS

(71) Applicant: TOKYO ELECTRON LIMITED, Tokyo (JP)

(72) Inventors: Yusuke Suzuki, Nirasaki (JP); Tsuyoshi Moriya, Nirasaki (JP); Kazuhide Hasebe, Nirasaki (JP); Atsushi Endo, Nirasaki (JP); Satoshi Tanaka, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 476 days.

(21) Appl. No.: 17/291,930

(22) PCT Filed: Oct. 30, 2019

(86) PCT No.: PCT/JP2019/042540
§ 371 (c)(1),
(2) Date: May 6, 2021

(87) PCT Pub. No.: WO2020/095787
PCT Pub. Date: May 14, 2020

(65) Prior Publication Data
US 2022/0010424 A1 Jan. 13, 2022

(30) Foreign Application Priority Data
Nov. 7, 2018 (JP) .................................. 2018-210065

(51) Int. Cl.
*C23C 16/42* (2006.01)
*C23C 16/04* (2006.01)
(Continued)

(52) U.S. Cl.
CPC ...... *C23C 16/042* (2013.01); *C23C 16/45597* (2013.01); *H01L 21/3086* (2013.01); *H01L 22/12* (2013.01)

(58) Field of Classification Search
None
See application file for complete search history.

(56) References Cited

U.S. PATENT DOCUMENTS

2005/0130356 A1* 6/2005 Yotsuya ............... H10K 71/166
118/715
2008/0017109 A1* 1/2008 Chiang ............. H01L 21/67236
118/719
(Continued)

FOREIGN PATENT DOCUMENTS

JP 2001-093863 A 4/2001
JP 2014-058703 A 4/2014
(Continued)

OTHER PUBLICATIONS

PCT International Search Report and Written Opinion, PCT Application No. PCT/JP2019/042540, Jan. 28, 2020, 11 pages (with English translation of PCT International Search Report).

*Primary Examiner* — Mandy C Louie
(74) *Attorney, Agent, or Firm* — Fenwick & West LLP

(57) ABSTRACT

A film forming method is provided. In the film forming method, a mask is prepared based on a measurement result of a surface state of a substrate. The mask is transferred into a process chamber and the substrate is transferred into the process chamber. Then, a film is formed on a back surface of the substrate while the mask is disposed onto the back surface of the substrate.

10 Claims, 9 Drawing Sheets

(51) Int. Cl.
  *C23C 16/455*  (2006.01)
  *H01L 21/308*  (2006.01)
  *H01L 21/66*   (2006.01)

(56) References Cited

U.S. PATENT DOCUMENTS

| | | | |
|---|---|---|---|
| 2009/0317562 A1* | 12/2009 | Dieguez-Campo | C23C 16/54 |
| | | | 204/192.1 |
| 2011/0027463 A1* | 2/2011 | Riordon | H01L 21/67213 |
| | | | 427/75 |
| 2018/0068861 A1 | 3/2018 | devilliers | |
| 2019/0148211 A1* | 5/2019 | Seo | C23C 16/4583 |
| | | | 118/728 |
| 2020/0105531 A1* | 4/2020 | Liu | C23C 14/0617 |

FOREIGN PATENT DOCUMENTS

| | | | |
|---|---|---|---|
| JP | 2018-041080 A | | 3/2018 |
| KR | 101098968 | * | 12/2011 |
| WO | WO 2011/136075 A1 | | 11/2011 |

* cited by examiner

| PROCESS A | MASK Ma |
| --- | --- |
| PROCESS B | MASK Mb |
| ⋮ | ⋮ |

| PROCESS A | MASK a1, MASK a2 |
|---|---|
| PROCESS B | MASK b1, MASK b2 |
| ⋮ | ⋮ |

FILM FORMING METHOD AND SEMICONDUCTOR PRODUCTION APPARATUS

TECHNICAL FIELD

The present disclosure relates to a film forming method and a semiconductor production apparatus.

BACKGROUND

For example, Patent Document 1 suggests a technique for forming a conductive film on a back surface of the wafer by sputtering in which a mask having holes of a desired pattern formed in advance is used so that a metal is deposited only on portions corresponding to the holes during sputtering. By using such a conductive film, stress caused over the entire surface of the wafer is reduced. Accordingly, warpage of the wafer is reduced.

RELATED ART

Patent Document 1: Japanese Patent Application Publication No. 2001-93863

SUMMARY

In view of the above, the present disclosure provides a technique capable of compensating local warpage of a substrate.

In accordance with an aspect of the present disclosure, there is provided a film forming method including: preparing a mask based on a measurement result of a surface state of a substrate; transferring the mask into a process chamber; transferring the substrate into the process chamber; and forming a film on a back surface of the substrate while the mask is disposed onto the back surface of the substrate.

Effect of the Invention

In accordance with one aspect, the local warpage of the substrate can be compensated.

DETAILED DESCRIPTION

Figure 1:
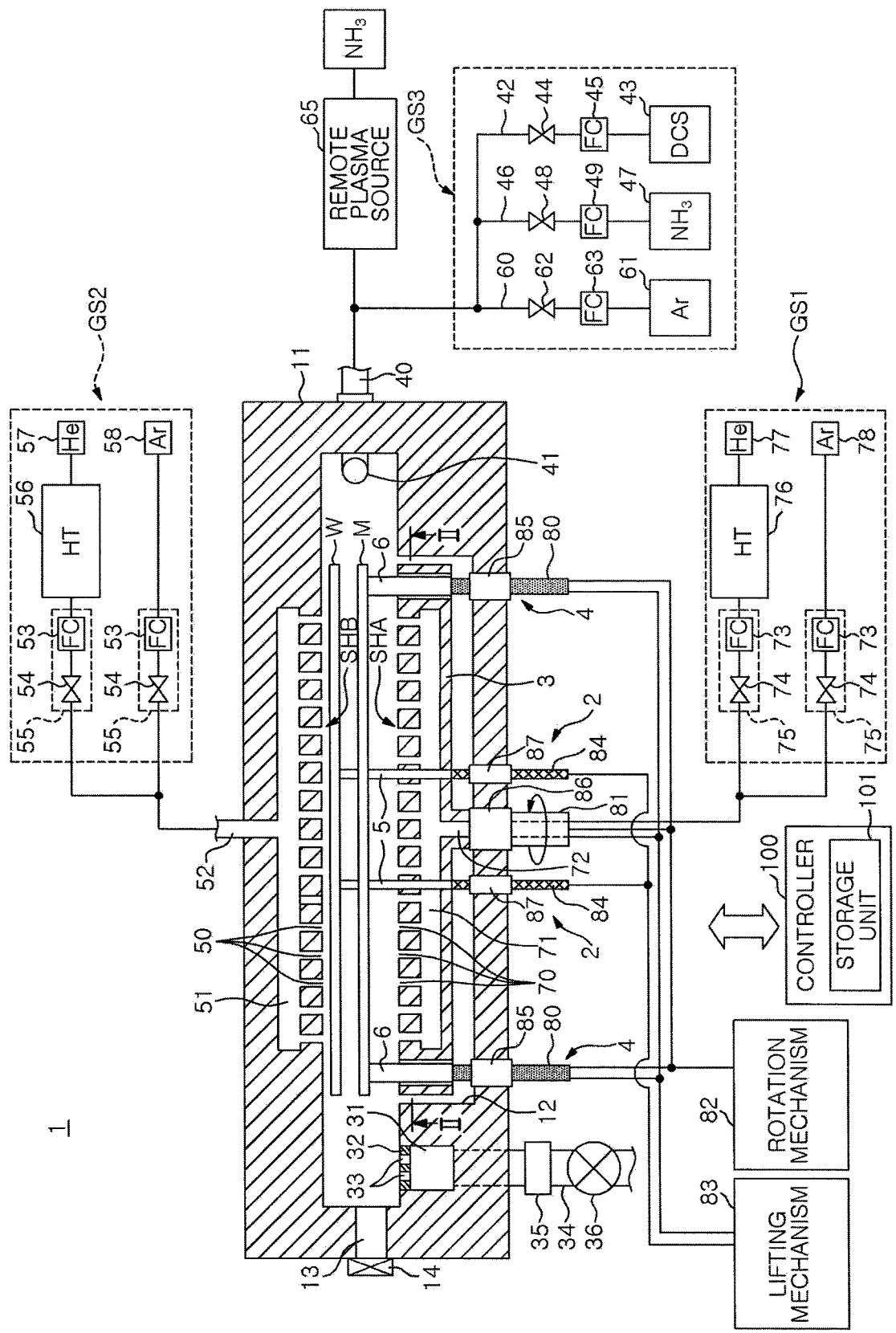
FIG. 1 is a vertical cross-sectional view showing an example of a configuration of a semiconductor production apparatus according to an embodiment.

Hereinafter, embodiments of the present disclosure will be described in detail with reference to the accompanying drawings. Like reference numerals will be given to substantially like parts throughout the specification and the drawings, and redundant description thereof will be omitted.

Semiconductor Production Apparatus

First, a configuration of a semiconductor production apparatus 1 according to an embodiment of the present disclosure will be described with reference to FIG. 1. FIG. 1 is a vertical cross-sectional view showing an example of the configuration of the semiconductor production apparatus according to the embodiment. In the embodiment, the semiconductor production apparatus 1 performs an atomic layer deposition (ALD) method for forming a film by laminating atomic layers or molecular layers by alternately supplying a source gas and a reaction gas to a substrate.

The semiconductor production apparatus 1 includes a process chamber 11 that is a vacuum container where film formation is performed on a wafer W. A loading/unloading port 13 for loading and unloading the wafer W and a gate valve 14 for opening and closing the loading/unloading port 13 are disposed on a sidewall surface of the process chamber 11.

A gas shower head SHB for introducing a gas in a shower-like manner from gas holes 50 is formed at a ceiling portion of the process chamber 11. Further, a gas shower head SHA for introducing a gas in a shower-like manner from gas holes 70 is disposed at a recess 12 formed at a bottom portion of the process chamber 11 to face the gas shower head SHB. A stage 3 where the gas shower head SHA is formed is accommodated in the recess 12.

A first support mechanism 2 includes a plurality of lifter pins 5 penetrating through the stage 3 and a jig 84 for pushing up the lifter pins 5. The lifter pins 5 are pushed upward by the jig 84, so that the wafer W can be supported to be vertically movable.

A second support mechanism 4 includes a plurality of lifter pins 6 penetrating through the stage 3 and a jig 80 for pushing up the lifter pins 6. The lifter pins 6 are pushed upward by the jig 80, so that a mask M can be supported to be vertically movable. However, the lifter pins 6 may not have a vertically movable function as long as they can support the mask M at a position above the stage 3.

Figure 2:
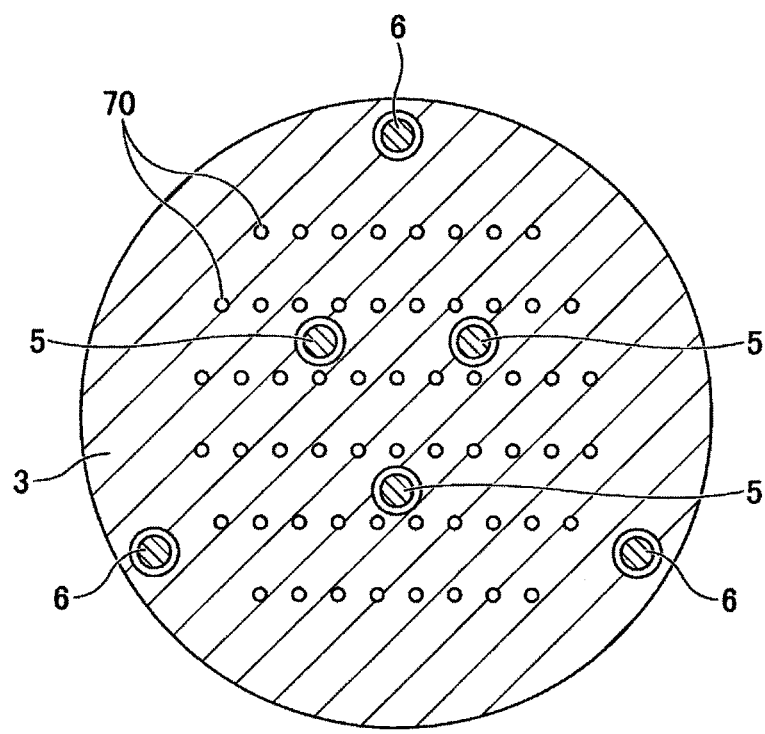
FIG. 2 shows a cross-sectional view taken along a line II-II of FIG. 1.

FIG. 2 shows a cross-sectional view taken along a line II-II of FIG. 1. As shown in FIG. 2, the stage 3 includes holes through which the lifter pins 5 penetrate on an inner peripheral side, holes through which the lifter pins 6 penetrate on an outer peripheral side, and gas holes 70 formed therebetween and a center portion. In the present embodiment, the wafer W is supported by three lifter pins 5, and the mask M is supported by three lifter pins 6. However, the number of the lifter pins 5 and the number of the lifter pins 6 are not limited thereto, and four or more lifter pins 5 and four or more lifter pins 6 may be provided.

Referring back to FIG. 1, a rotation mechanism 82 and a lifting mechanism 83 are connected to a support 81 for supporting the stage 3. The rotation mechanism 82 rotates the stage 3 by motor power. Accordingly, the wafer W is rotated by the rotation mechanism 82 while being supported by the first support mechanism 2. Further, the lifting mechanism 83 vertically moves the stage 3 by the power of the motor.

A portion where the support 81 penetrates through the bottom of the process chamber 11 is sealed with a magnetic seal 86, and portions where the lifter pins 5 and 6 penetrate through the bottom of the process chamber 11 are sealed with magnetic seals 87 and 85, respectively. Accordingly, the inside of the process chamber 11 is airtightly maintained, and a vacuum state in the processing chamber is maintained at a predetermined vacuum level.

A gas exhaust groove 31 that is a gas exhaust port is formed at one longitudinal end side of the bottom portion of the process chamber 11. In the longitudinal direction of the process chamber 11, one end side where the gas exhaust groove 31 is formed is defined as a downstream side, and the other end side opposite to the one end side where the gas exhaust groove 31 is formed is defined as an upstream side.

A lid 32 having multiple slits 33 is disposed at an opening of the gas exhaust groove 31. A gas exhaust line 34 is connected to a bottom portion of the gas exhaust groove 31. A pressure controller 35 and a gas exhaust valve 36 are arranged in the gas exhaust line 34 from the gas exhaust groove 31 side and are connected to a vacuum pump (not shown).

A film forming gas injection portion 41 is disposed at the upstream side of the process chamber 11. A slit(s) is formed at the film forming gas injection portion 41 in a longitudinal direction of the film forming gas injection portion 41. The film forming gas is introduced from the film forming gas injection portion 41 and passes through the entire front surface of the wafer W.

A gas supply line 40 is connected to the film forming gas injection portion 41. A third gas supply source GS3 for supplying a third gas from a sidewall of the process chamber is connected to the gas supply line 40. A source gas supply line 42 for supplying a source gas, a reaction gas supply line 46 for supplying a reaction gas that reacts with the source gas, and a replacement gas supply line 60 for supplying a replacement gas are joined to the third gas supply source GS3.

A dichlorosilane (hereinafter, referred to as "DCS") supply source 43 for supplying a DCS gas that is an example of the source gas is connected to the source gas supply line 42. A flow controller (FC) 45 for controlling a gas flow of the DCS gas and a valve 44 for controlling on/off of the supply of the DCS gas are disposed in the source gas supply line 42.

An $NH_3$ supply source 47 for supplying an $NH_3$ gas that is an example of the reaction gas is connected to the reaction gas supply line 46. A flow controller (FC) 49 for controlling a gas flow of the $NH_3$ gas and a valve 48 for controlling on/off of the supply of the $NH_3$ gas are disposed in the reaction gas supply line 46. In this example, the source gas and the reaction gas are also referred to as "film forming gas." The DCS gas and the $NH_3$ gas are examples of the third gas.

An Ar gas supply source 61 for supplying Ar gas that is an example of the replacement gas (purge gas) is connected to the replacement gas supply line 60. A flow controller (FC) 63 for controlling a gas flow of the Ar gas and a valve 62 for controlling on/off of the supply of the Ar gas are disposed in the replacement gas supply line 60.

Further, the third gas supply source GS3, the film forming gas injection portion 41, and the gas supply line 40 are examples of a third gas supply unit for supplying the third gas in a radial direction of the wafer W supported by the first support mechanism 2. The third gas supply unit supplies the third gas in the radial direction of the wafer W supported by the first support mechanism 2.

A remote plasma source 65 is connected to the gas supply line 40. The remote plasma source 65 supplies plasma from the sidewall of the process chamber 11. The supply of the third gas from the third gas supply source GS3 and the supply of the plasma from the remote plasma source 65 are switched by controlling the valves 44 and 48 in the third gas supply source GS3 and the remote plasma source 65.

A second gas supply source GS2 for supplying a gas for adjusting concentration of the film forming gas, e.g., Ar gas that is a dilution gas or a heated He gas, is connected to the gas shower head SHB through the gas supply line 52.

The second gas supply source GS2 is divided into two systems, each of which is provided with a flow controller (FC) 53 and a valve 54. The flow controller 53 and the valve 54 are also referred to as "gas adjusting unit 55." A He gas supply source (He) 57 is connected to one gas adjusting unit 55 and an Ar gas supply source (Ar) 58 is connected to the other gas adjusting unit 55. A heater (HT) 56 heats the He gas supplied from the He gas supply source 57. The heated He gas and the Ar gas that is supplied from the Ar gas supply source 58 are switched by the control of the valves 54 to be supplied to the gas shower head SHB and introduced into the process chamber 11 from the gas holes 50 through the buffer chamber 51. The He gas functions as a purge gas that prevents the film forming gas from flowing to the front surface of the wafer W. Further, the Ar gas functions as a dilution gas for the film forming gas.

The gas holes 50 are formed in the longitudinal direction from the upstream side toward the downstream side of the flow of the film forming gas such as DCS supplied from the sidewall of the process chamber 11. The gas holes are formed of holes or slits extending in a width direction to cover the entire surface of the wafer W in plan view. Accordingly, the Ar gas serving as the dilution gas or the heated He gas is supplied from the gas holes 50 toward the front surface of the wafer W supported by the first support mechanism 2 in a state where the gas flows thereof are uniform in the width direction.

The He gas is an example of a second gas. The second gas supply source GS2 and the gas shower head SHB are examples of a second gas supply unit for supplying the second gas to the front surface of the wafer W supported by the first support mechanism 2. The second gas is not limited to He gas, and an inert gas may be heated and supplied as the second gas. Further, the dilution gas supplied from the gas shower head SHB is not limited to Ar gas, and an inert gas such as $N_2$ gas may be used as the dilution gas.

In the case of forming a film on the back surface of the wafer W, the wafer W is moved up by the first support mechanism 2 to be close to the second gas supply unit, and the second gas and the third gas are supplied. When forming a film on the back surface of the wafer W, the second gas supply unit supplies an inert gas such as a heated He gas as the second gas to prevent film formation on the front surface of the wafer W.

A first gas supply source GS1 for supplying a gas for adjusting the concentration of the film forming gas, e.g., Ar gas that is a dilution gas or a heated He gas, is connected to the gas shower head SHA through the gas supply line 72.

The first gas supply source GS1 is divided into two systems, each of which is provided with a flow controller (FC) 73 and a valve 74. The flow controller 73 and the valve 74 are also referred to as "gas adjusting unit 75." A He gas supply source (He) 77 is connected to one gas adjusting unit 75, and an Ar gas supply source (Ar) 78 is connected to the other gas adjusting unit 75. A heater (HT) 76 heats the He gas supplied from the He gas supply source 77. The heated He gas and the Ar gas that is supplied from the Ar gas supply source 78 are switched by the control of the valves 74 to be supplied to the gas shower head SHA and introduced into the process chamber 11 from the gas holes 70 through the buffer chamber 71. The He gas functions as a purge gas that prevents the film forming gas from flowing to the back surface of the wafer W. Further, the Ar gas functions as a dilution gas for the film forming gas.

The gas holes 70 are formed in the longitudinal direction from the upstream side toward the downstream side of the flow of the film forming gas supplied from the sidewall of the process chamber 11. The gas holes 70 are formed of holes or slits extending in the width direction to cover the entire surface of the wafer W in plan view. Accordingly, Ar gas serving as a dilution gas or the heated He gas is supplied from the gas holes 70 toward the back surface of the wafer W supported by the first support mechanism 2 in a state where the gas flows thereof are uniform in the width direction.

The He gas is an example of a first gas. The first gas supply source GS1 and the gas shower head SHA are examples of a first gas supply unit for supplying the first gas to the back surface of the wafer supported by the first support mechanism 2. The first gas is not limited to He gas, and an inert gas may be heated and supplied as the first gas. Further, the dilution gas supplied from the gas shower head SHA is not limited to Ar gas, and an inert gas such as $N_2$ gas may be used as the dilution gas.

In the case of forming a film on the front surface of the wafer W, the wafer W is moved down by the first support mechanism 2 to be close to the gas shower head SHA, and the first gas is supplied to the back surface of the wafer W and the third gas is supplied to the front surface of the wafer W. when forming a film on the front surface of the wafer W using the third gas, an inert gas such as a heated He gas is supplied as the first gas to the back surface of the wafer W to prevent film formation on the back surface of the wafer W.

On the other hand, in the case of forming a film on the back surface of the wafer W, the wafer W is moved to be close to the gas shower head SHB, and the second gas is supplied to the front surface of the wafer W and the third gas is supplied to the back surface of the wafer W. When forming a film on the back surface of the wafer W using the third gas, an inert gas such as a heated He gas is supplied as the second gas to the front surface of the wafer W to prevent film formation on the front surface of the wafer W.

In the following description, the film formation on the front surface of the wafer W in the semiconductor production apparatus 1 configured as described above will be briefly described. First, the gate valve 14 is opened, and the wafer W loaded from the outside by a transfer arm is held by the first support mechanism 2. Then, the gate valve is closed to seal the process chamber 11. Then, the supply of the Ar gas from the film forming gas injection portion 41 is started to perform an exhaust operation through the gas exhaust groove 31 and adjust a pressure in the process chamber 11. Next, the first support mechanism 2 is lowered. The mask M is not required when a film is formed on the front surface of the wafer W.

Then, the film formation on the front surface of the wafer is performed by the ALD method using, as a film forming gas, a DCS gas serving as a source gas and an $NH_3$ gas serving as a reaction gas. A method of supplying the film forming gas to the wafer W will be described. In a state where the exhaust operation is performed through the gas exhaust groove 31, the supply of the film forming gas to the wafer W held by the first support mechanism 2 is started and, at the same time, the dilution gas is supplied from the gas shower head SHB toward the front surface of the wafer W. The film forming gas flows into the film forming gas injection portion 41 from the gas supply line 40, and then is diffused uniformly in the film forming gas injection portion 41. Thereafter, the film forming gas is supplied at a uniform gas flow in the width direction of the wafer W from the slit(s) of the film forming gas injection portion 41, and the film forming gas flows along the entire front surface of the wafer W. Then, the film forming gas flows into the gas exhaust groove 31 while maintaining a parallel flow, and the film forming gas is exhausted from the gas exhaust line 34.

Then, the rotation mechanism 82 is driven to rotate the wafer W on the stage 3 around the axis of the support 81. Accordingly, the concentration of the film forming gas becomes uniform in the width direction of air flow and continuously changes in one direction. When viewed from each part of the wafer W, the state in which the concentration of the film forming gas gradually decreases and then gradually increases is repeated. When the wafer W is rotated once, the portions having the same distance from the center pass through the same region and, thus, a film thickness is uniform in a circumferential direction. The film thickness is determined by a temporal density change pattern during one rotation of the corresponding portion. Therefore, a thin film formed on the front surface of the wafer W has concentric film thickness distribution, and the film thickness distribution is determined by concentration distribution in a flow direction of the film forming gas near the front surface of the wafer W. As described above, the concentration distribution of the film forming gas is determined by a degree of dilution by the dilution gas supplied from the gas holes 50. Therefore, the concentration distribution of the film forming gas can be adjusted by changing the gas flow of the dilution gas supplied from the gas holes 50 using the gas adjusting unit 55. In the case of processing the back surface of the wafer W, the mask M is used to locally form a film on the back surface of the wafer W. The processing of the back surface will be described in detail later.

The semiconductor production apparatus 1 includes a controller 100 for controlling the operation of the entire apparatus. The controller 100 executes the film formation based on a recipe stored in a storage unit 101 such as a read only memory (ROM), a random access memory (RAM), or the like. The recipe includes apparatus control information for process conditions, such as a process time, a pressure (gas exhaust), a radio frequency power and/or a voltage, various gas flow rates, temperatures in the process chamber (temperatures of an upper electrode, a process chamber sidewall, a wafer W, an electrostatic chuck, and the like), and a temperature of a coolant from a chiller. The controller 100 controls the supply of the first gas to the third gas based on the procedure of the recipe, and controls the film formation on the front surface of the wafer W and the film formation on the back surface of the wafer W. Further, the controller 100 controls a process of cleaning deposits adhered to an inner surface of the process chamber in the film formation based on the procedure of the recipe.

The recipe including such programs or processing conditions may be stored in a hard disk or a semiconductor memory. Further, the recipe may be set and read out from a predetermined position while being stored in a storage medium that can be read by a portable computer such as a CD-ROM, a DVD, or the like.

Although the semiconductor production apparatus 1 of FIG. 1 can perform the film formation on the front surface and the film formation on the back surface of the wafer W, the semiconductor production apparatus using the film forming method according to the embodiment is not limited thereto, and may be an apparatus capable of forming a film on the back surface of the wafer.

Creation of a Mask

Next, the creation of a mask used for forming a film on the back surface of the wafer W will be described. When a film is formed on the front surface of the wafer W, stress of the film on the wafer W causes not only overall deformation in which the wafer W is warped in a bow shape but also local deformation (hereinafter, also referred to as "local stress") due to the pattern formed on the front surface of the wafer W.

Particularly, when films are laminated on the wafer W, local stress occurs due to non-uniform thicknesses of the films formed on the wafer W. Such deformation, caused by the thickness or the pattern of the film, deteriorates the overlay, which is the overlapping with an underling pattern, in a step of exposing the wafer W using a pattern of a resist layer or in subsequent steps. Therefore, in the present embodiment, a film is locally formed on the back surface of the wafer W to reduce the local stress depending on the state of the film formed on the front surface of the wafer W. Accordingly, the local warpage of the wafer W is compensated.

First, a mask having the same shape and the same size as those of the wafer W is prepared, and a hole(s) is formed at a portion(s) of the mask corresponding to a desired film formation portion(s) on the back surface of the wafer W. When the mask M having the hole (film formation pattern) is created, a film is formed on the back surface of the wafer W using the pattern of the mask M. The desired film formation portion on the back surface of the wafer W is changed depending on the location where the local deformation occurs on the front surface of the wafer W. The location where the local deformation occurs on the front surface of the wafer W can be determined by measuring a height of the film on the wafer W. Therefore, the mask having a pattern that compensates the local warpage of the wafer W is created based on the measured height of the film on the wafer W.

The height of the film on the wafer W is measured after the film is formed on the wafer and before the resist layer is exposed and patterned. The height of the film on the wafer W can be measured by a measuring device such as a laser beam displacement meter or the like. For example, the laser beam displacement meter can be disposed at a ceiling portion of the measuring device and moved horizontally at a position above the wafer W placed on a substrate support in the measuring device. Hence, a laser beam can be irradiated to the wafer W while scanning the wafer W. Since the laser beam measures light reflected from the wafer W, the height of the film formed on the wafer W can be measured. Accordingly, it is possible to obtain a measurement result indicating the height of the film for each horizontal (x, y) coordinate on the wafer W. The measurement result corresponds to warpage on the wafer W. In other words, local deformation or warpage of the wafer W occurs due to the presence of a film or a thick portion and a thin portion of a film. Accordingly, the mask M corresponding to the local deformation or warpage of the wafer W can be created based on the measurement result.

The state of the local deformation or warpage of the wafer W varies depending on film structure differences such as a type of a film formed on the wafer W, a film thickness, and a laminated state. Therefore, a height of a film is measured for each of multiple wafers W having different film structures, and a mask M having a pattern corresponding to local deformation or warpage is created for each wafer W based on the measurement result. In the case of film formation on the back surface, the created mask M is used to form a film on the back surface of the wafer W using a pattern of the mask M corresponding to the deformation or the warpage of the wafer W. Accordingly, the local warpage of the wafer W can be compensated.

Buffer Chamber

Figure 3:
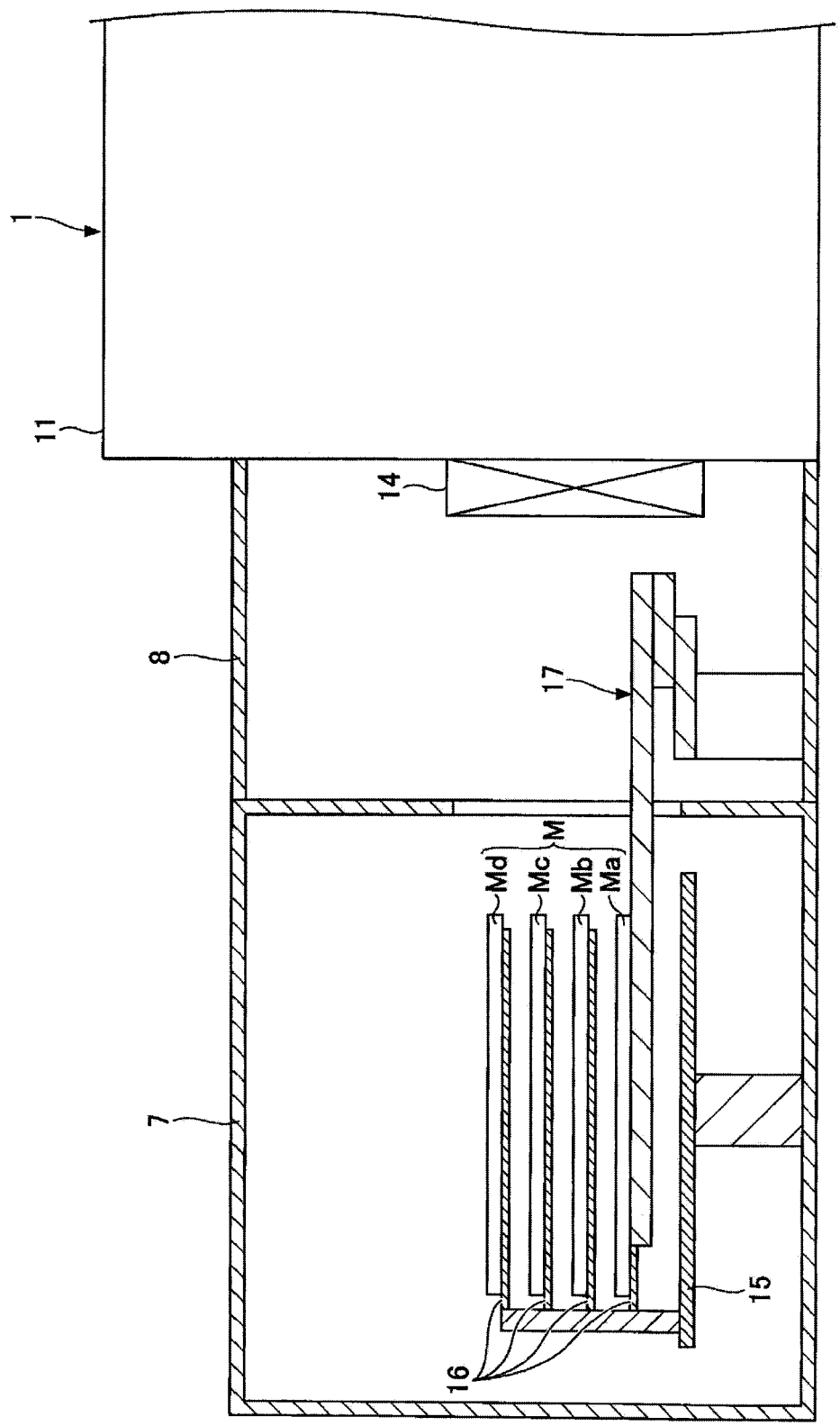
FIG. 3 shows an example of a buffer chamber and a transfer device according to an embodiment.

As shown in FIG. 3, the created masks M are respectively held on shelves 16 of a mounting table 15 that are vertically arranged in a buffer chamber 7 adjacent to the semiconductor production apparatus 1. A transfer chamber 8 is disposed adjacent to the buffer chamber 7. A transfer device 17 holds on an arm thereof a mask M suitable for a specific process for the front surface processing of the wafer W. The gate valve 14 of the semiconductor production apparatus 1 is opened, and the mask M is transferred into the process chamber 11. The process corresponds to each film structure on the wafer W. By selecting the mask M suitable for a specific process, it is possible to extract the mask M corresponding to the film structure of the wafer W, i.e., corresponding to warpage or deformation of the wafer W serving as a film formation target. The buffer chamber 7 and the transfer chamber 8 are maintained in an airtight state.

Figures 4, 5:
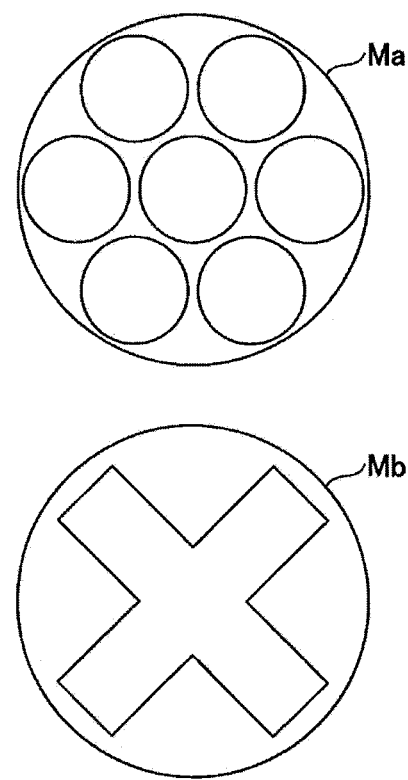
FIG. 4 shows an example of mask information of a storage unit according to an embodiment.
FIG. 5 shows examples of a mask according to an embodiment.

The controller 100 controls the transfer device 17 to extract the mask M suitable for the specific process for the front surface processing of the wafer W from the buffer chamber 7 and transfer the mask M into the semiconductor production apparatus 1. For example, the controller 100 refers to a table of FIG. 4 stored in the storage unit 101 of FIG. 1 to determine the mask M suitable for the specific process as a transfer target. In the example of FIG. 4, information of "mask Ma" is stored in association with a process A, and information of "mask Mb" is stored in association with a process B.

In this case, when the specific process is the process A, the controller 100 selects the mask Ma, and the mask Ma is transferred among the masks M held in the buffer chamber 7. The mask Ma and the mask Mb are different masks, and examples thereof are shown in FIG. 5. In a state where the mask Ma is transferred in the process chamber 11 and disposed onto the back surface of the wafer W, a film is formed on the back surface of the wafer W. The controller 100 determines a specific process to be executed on the front surface of the wafer W from the recipe.

Figures 6, 7:
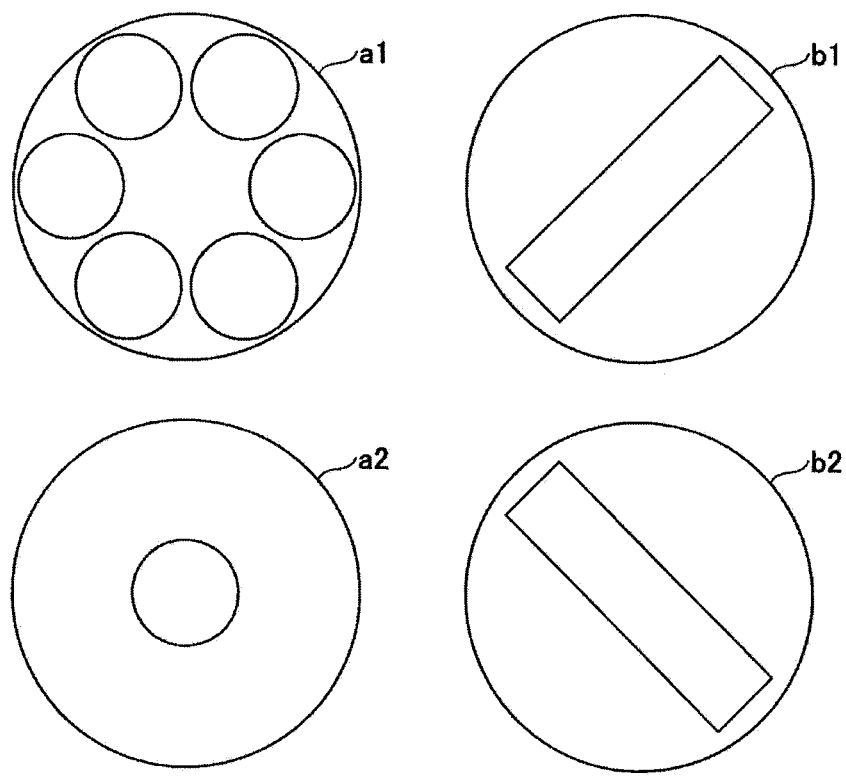
FIG. 6 shows an example of the mask information of a storage unit according to an embodiment.
FIG. 7 shows examples of the mask according to an embodiment.

The controller 100 may refer to, for example, a table of FIG. 6 stored in the storage unit 101 of FIG. 1, to determine the mask M suitable for a specific process as a transfer target. In the example of FIG. 6, mask information of "mask a1 and mask a2" is stored in association with the process A, and mask information of "mask b1 and mask b2" is stored in association with the process B.

In this case, when the specific process is the process A, the controller 100 selects the masks a1 and a2. The mask a1 and the mask a2 are different masks, and examples thereof are shown in FIG. 7. Accordingly, among the masks M held in the buffer chamber 7, the masks a1 and a2 are sequentially transferred into the process chamber 11, and a film is formed on the back surface of the wafer W in a state where the masks a1 and a2 are sequentially disposed onto the back surface of the wafer W. For example, film formation is performed on the back surface of the wafer W while the mask a1 is disposed onto the back surface of the wafer W. Then, the mask a1 is extracted, and the mask a2 is transferred into the process chamber 11. Then, the film formation is performed on the back surface of the wafer W while the mask a2 is disposed onto the back surface of the wafer W. On the contrary, a film may be formed on the back surface of the wafer W while the masks a2 and a1 are sequentially disposed onto the back surface of the wafer W.

The material of the mask M is preferably quartz that does not easily deteriorate during the cleaning process. However, the material of the mask M is not limited thereto, and the mask M may be made of a material other than a metal. Further, since the mask M has the same shape and the same size as those of the wafer W, the mask M can be transferred by the transfer device in the same manner as the transfer of the wafer W.

Transfer Sequence of Mask and Wafer

Next, a transfer sequence of the mask M and the wafer W at the time of forming a film on the back surface of the wafer W while the mask M is disposed onto the back surface of the wafer W using the semiconductor production apparatus 1 will be described with reference to FIG. 8.

First, the controller 100 prepares a mask corresponding to the measurement result of the wafer W. The mask may be prepared by selecting the mask M suitable for a specific process among the masks M held in the buffer chamber 7, or the mask may be prepared by creating the mask M in another method.

Next, the controller 100 opens the gate valve 14 and transfers the mask M into the process chamber 11. For example, the controller 100 refers to the storage unit 101 to select the mask M suitable for the specific process, and controls the transfer device 17 to extract the specified mask M from the buffer chamber 7 and transfer the specified mask M to a position above the stage 3 in the process chamber 11. The controller 100 drives the lifting mechanism 83 to raise the lifter pins 6 and holds the mask M on the lifter pins 6 as shown in "a1" of FIG. 8.

After the mask M is transferred into the process chamber 11, the controller 100 transfers the wafer W into the process chamber 11. The controller 100 drives the lifting mechanism 83 to raise the lifter pins 5 to a position above the mask M, and holds the wafer W on the lifter pins 5 as shown in "a2" of FIG. 8.

Figure 8:
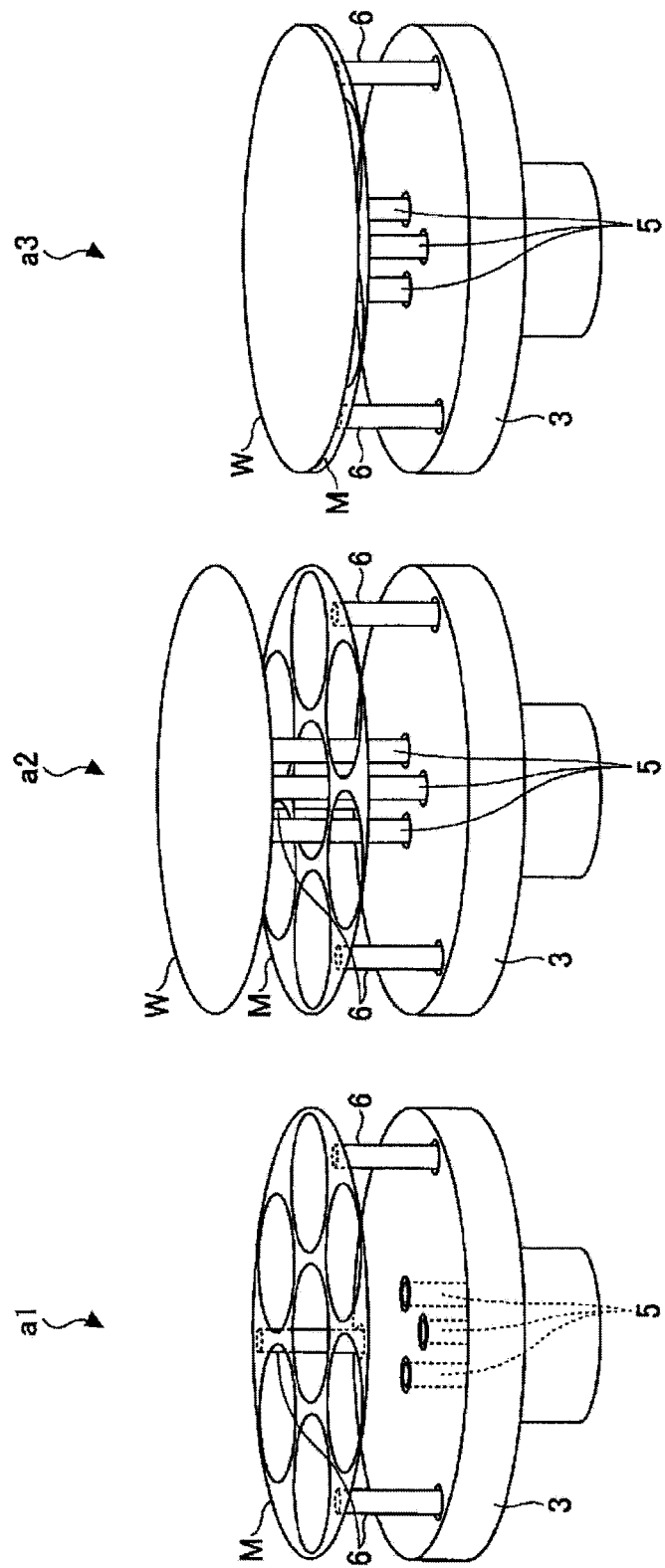
FIG. 8 shows an example of a sequence of transferring a mask and a wafer according to an embodiment.

Next, the controller 100 lowers the lifter pins 5 to the position of the mask M, and a film is formed on the back surface of the wafer W while the mask M is disposed onto the back surface of the wafer W as shown in "a3" of FIG. 8.

When the film is formed on the back surface of the wafer W while the mask M is disposed onto the back surface of the wafer W by the above-described sequences, by-products are adhered to the mask M. The by-products adhered to the mask M may be cleaned during the cleaning of the inside of the process chamber 11 that is performed whenever a predetermined period of time elapses.

In the case of extracting the wafer W, the controller 100 raises the lifter pins 5 from the state of "a3" in FIG. 8 to the state of "a2" in FIG. 8. Then, the controller 100 separates the wafer W from the mask M, and extracts the wafer W from the process chamber 11. The process chamber 11 and the mask M can be cleaned by cleaning the inside of the process chamber 11 in the state of "a1" of FIG. 8 after the extraction of the wafer W and before the transfer of a next wafer W.

Mask Creation Process

Figure 9:
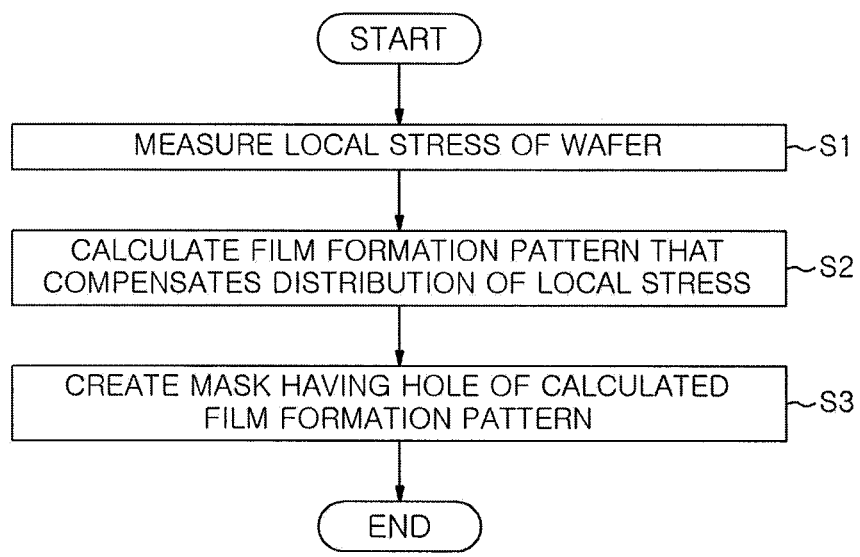
FIG. 9 is a flowchart showing an example of a mask creation process according to an embodiment.

Next, an example of a process of creating the mask M according to an embodiment will be described with reference to FIG. 9. The process of creating the mask M is executed before the process of forming a film on the back surface of the wafer W.

When this process is started, the controller 100 measures the local stress of the wafer W using the measuring device (step S1). For example, the local stress of the wafer W is measured by measuring the height of the film on the wafer W for each (x, y) coordinate using the measuring device such as a laser beam displacement meter or the like.

Next, the controller 100 calculates distribution of the local stress on the wafer W based on the measurement result, and calculates a film formation pattern on the back surface of the wafer W that compensates the distribution of the local stress (step S2). Next, the controller 100 creates a mask M having a hole(s) of the calculated film formation pattern (step S3), and terminates the process.

Back Surface Film Formation

Figure 10:
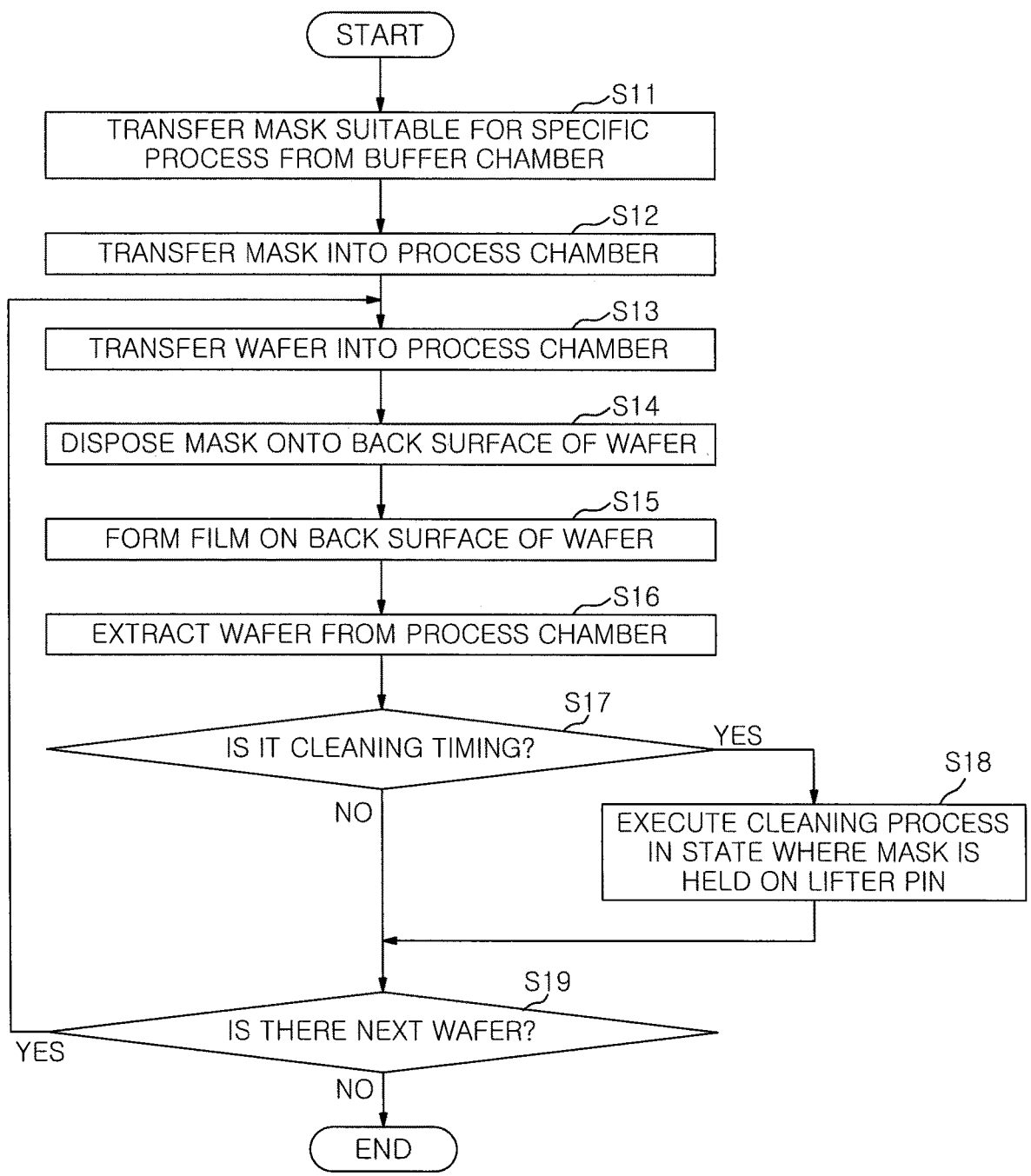
FIG. 10 is a flowchart showing an example of a back surface film formation according to an embodiment.

Next, an example of a process of forming a film on the back surface of the wafer W according to an embodiment will be described with reference to FIG. 10. The process of forming a film on the back surface of the wafer W is executed using the mask M created based on the flowchart of FIG. 9.

When this process is started, the controller 100 transfers the mask M suitable for the specific process from the buffer chamber 7 (step S11). Next, the controller 100 transfers the mask M into the process chamber 11 of the semiconductor production apparatus 1 (step S12). Accordingly, the mask M is held on the lifter pins 6 as shown in "a1" of FIG. 8.

Next, the controller 100 transfers the wafer W into the process chamber 11 (step S13). Accordingly, the wafer W is held on the lifter pins 5 above the mask M as shown in "a2" of FIG. 8.

Next, the controller 100 lowers the lifter pins 5 to dispose the mask M onto the back surface of the wafer W (step S14). Accordingly, the mask M is disposed onto the back surface of the wafer W as shown in "a3" of FIG. 8. The controller 100 may control at least one of the lifter pins 5 and the lifter pins 6 to dispose the mask M onto the back surface of the wafer W. At this time, the arrangement of the wafer W and the mask M is controlled such that no gap is formed between the back surface of the wafer W and the mask M.

Next, the controller 100 forms a film on the back surface of the wafer W using the pattern of the mask M (step S15). Next, the controller 100 raises the lifter pins 5 to lift the wafer W having the film formed on the back surface thereof to a position above the mask M, and controls the transfer arm to extract the wafer W from the process chamber (step S16).

Next, the controller 100 determines whether or not it is a cleaning timing (step S17). The controller 100 determines whether or not it is the cleaning timing by determining, for example, whether or not a predetermined time has elapsed from an initial time. When it is determined that it is the cleaning timing, the controller 100 executes a cleaning process in a state where the mask M is held on the lifter pin 6 as shown in "a1" of FIG. 8 (step S18), and then proceeds to step S19. For example, the cleaning process may be executed by supplying a cleaning gas from the third gas supply source GS3 in the semiconductor production apparatus 1 of FIG. 1. On the other hand, when it is determined in step S17 that it is not the cleaning timing, the controller 100 immediately proceeds to step S19.

Next, the controller 100 determines whether or not there is a next wafer W (step S19). When it is determined that there is a next wafer W, the controller 100 returns to step S13 and repeatedly executes the processes of steps S13 to S19 for the next wafer W. On the other hand, if it is determined in step S19 that there is no next wafer, the controller 100 terminates the process.

As described above, the method of forming a film on the back surface of the wafer W according to the present embodiment includes: preparing the mask M based on the measurement result of the height of the front surface of the wafer W indicating warpage or deformation of the wafer W, transferring the mask M into the process chamber 11, transferring the wafer W into the process chamber 11, and forming a film on the back surface of the wafer W while the mask M is disposed onto the back surface of the wafer W.

Therefore, the film is formed on the back surface of the wafer W using the pattern of the mask M corresponding to the warpage or deformation of the wafer W. Accordingly, the local warpage of the wafer W can be compensated.

Figure 11:
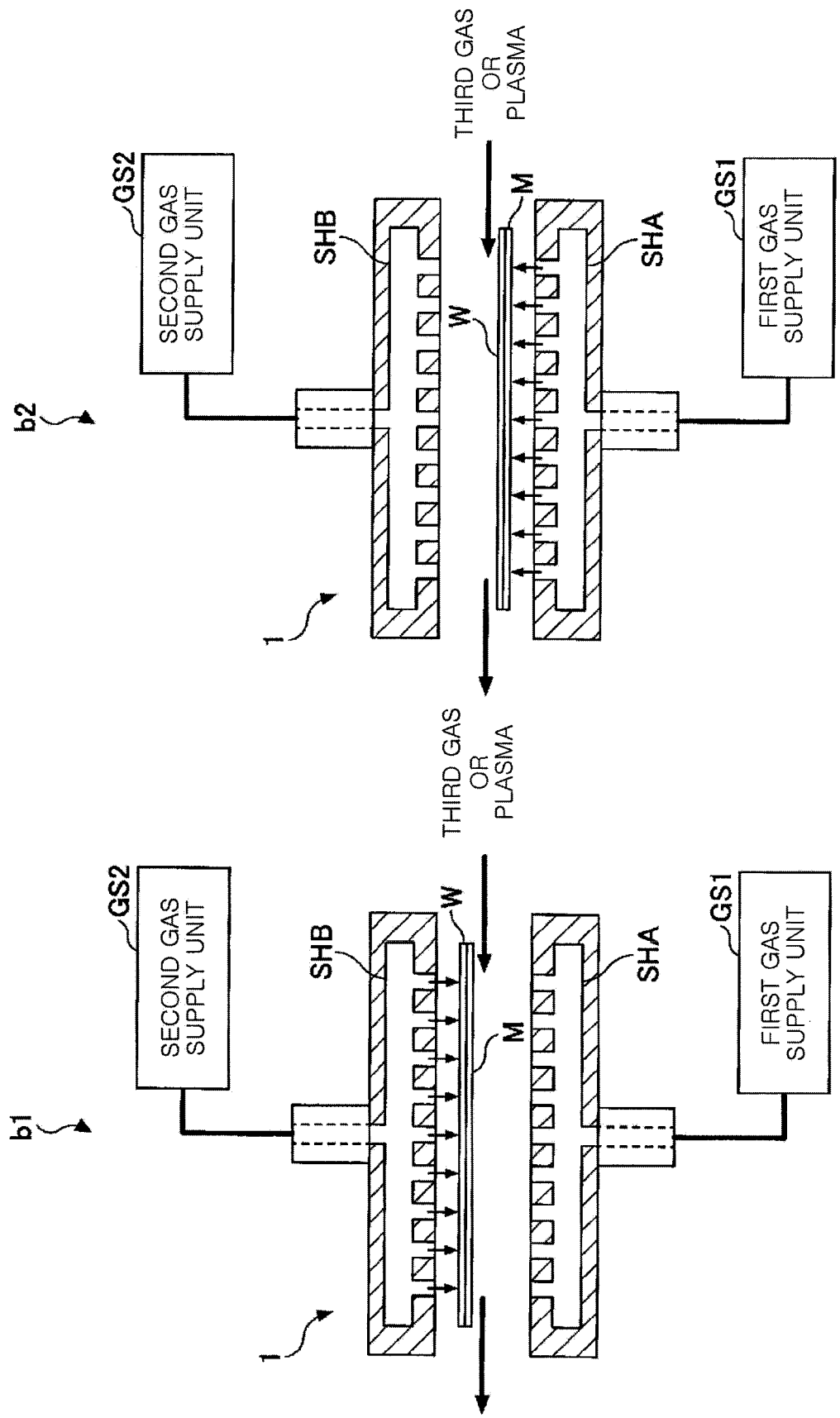
FIG. 11 shows an outline of switching between film formation on a front surface and film formation on a back surface according to an embodiment.

Switching Between Film Formation on the front surface of the wafer and Film Formation on the Back Surface of the Wafer Lastly, the switching between the film formation on the back surface of the wafer W and the film formation on the front surface of the wafer W will be described with reference to FIG. 11 showing the semiconductor production apparatus 1 of FIG. 1 in a simplified manner.

In the case of forming a film on the back surface of the wafer W, the wafer W and the mask M are moved to be close to the gas shower head SHB and the film formation is performed, as shown in "b1" of FIG. 11. At this time, the flow of the gas and the plasma to the front surface of the wafer W is sufficiently suppressed by supplying the heated He purge gas to the front surface of the wafer W in a shower-like manner through the gas shower head SHB.

In the case of forming a film on the front surface of the wafer W, the wafer W is moved to be close to the gas shower head SHA and the film formation is performed, as shown in "b2" of FIG. 11. At this time, the flow of the gas and the plasma to the back surface of the wafer W is sufficiently suppressed by supplying the heated He purge gas to the back surface of the wafer W in a shower-like manner through the gas shower head SHA. Here, the mask M may not be provided, or may be disposed on the back surface of the wafer W.

Film Formation on the Back Surface of the Wafer W

In the case of forming a film on the back surface of the wafer W, the controller 100 raises the lifter pins 5 and 6 so that the wafer W and the mask M are moved to be close to the gas shower head SHB, and supplies the second gas and the third gas to form the film on the back surface of the wafer W. The second gas is a heated He gas and the third gas is a film forming source gas.

In this case, the controller 100 opens the valve 54 connected to the He gas supply source 57 and closes the valve 54 connected to the Ar gas supply source 58 of the second gas supply source GS2 shown in FIG. 1. Further, the controller 100 opens the valve 44 and closes the valves 48 and 62 of the third gas supply source GS3. Thus, in the present embodiment, during the film formation on the back surface of the wafer W, the heated He gas is introduced from the gas shower head SHB and injected onto the front surface of the wafer W. Accordingly, it is possible to suppress the flow of the film forming gas to the front surface of the wafer W and prevent film formation on the front surface of the wafer W.

Further, by introducing the He gas into the space between the wafer W and the gas shower head SHB, it is possible to suppress ignition of plasma and plasma generation in the space between the wafer W and the gas shower head SHB, and also possible to block the film formation on the front surface of the wafer W.

In the case of performing a predetermined film formation on the back surface of the wafer W using the supplied film forming source gas, the controller 100 closes the valve 74 connected to the He gas supply source 77 and opens the valve 74 connected to the Ar gas supply source 78 of the first gas supply source GS1 shown in FIG. 1. Accordingly, Ar gas is supplied from the gas shower head SHA, and the film forming source gas is diluted to a predetermined concentration.

The controller 100 may close the valve 44 to stop the supply of the source gas, and supply plasma from the remote plasma source 65 to fix the source gas on the front surface of the wafer W. Further, the switching between the source gas, the reaction gas and the plasma may be controlled. Ar gas may be supplied from the Ar gas supply source 61 at a predetermined timing to purge the inside of the process chamber 11.

Film Formation on the Front Surface of Wafer W

In the case of forming a film on the front surface of the wafer W, the controller 100 lowers the lifter pins 5 and 6 to be close to the first gas supply unit, thereby moving the wafer W and the mask M to be close to the gas shower head SHA. Then, the controller 100 supplies the first gas and the third gas to form the film on the front surface of the wafer W. The first gas is a heated He gas and the third gas is a film forming source gas.

In this case, the controller 100 opens the valve 74 connected to the He gas supply source 77 and closes the valve 74 connected to the Ar gas supply source 78 of the first gas supply source GS1 shown in FIG. 1. Further, the controller 100 opens the valve 44 and closes the valves 48 and 62 of the third gas supply source GS3.

In the film forming process, a predetermined film formation is performed on the front surface of the wafer W using the supplied film forming source gas. At this time, the controller 100 closes the valve 54 connected to the He gas supply source 57 and opens the valve 54 connected to the Ar gas supply source 58 of the second gas supply source GS2 shown in FIG. 1. Accordingly, Ar gas is supplied from the gas shower head SHB, and the film forming source gas is diluted to a predetermined concentration.

Next, the controller 100 may close the valve 44 to stop the supply of the source gas, and supply plasma of $NH_3$ gas from the remote plasma source 65 to fix the source gas on the front surface of the wafer W. In this specification, the controller 100 controls the switching between the source gas and the plasma. However, the present disclosure is not limited thereto, and the switching between the source gas, the reaction gas, and the plasma may be controlled. Further, during the switching between the source gas and the plasma, Ar gas may be supplied from the Ar gas supply source 61 to purge the inside of the process chamber 11.

The film forming method and the semiconductor production apparatus according to the embodiments of the present disclosure are considered in all respects to be illustrative and not restrictive. The above-described embodiments can be embodied in various forms. Further, the above-described embodiments may be omitted, remounted, or changed in various forms without departing from the scope of the appended claims and the gist thereof. The above-described embodiments may include other configurations without contradicting each other and may be combined without contradicting each other.

This application claims priority to Japanese Patent Application No. 2018-210065, filed on Nov. 7, 2018, the entire contents of which are incorporated herein by reference.

DESCRIPTION OF REFERENCE NUMERALS

1: semiconductor production apparatus
2: first support mechanism
3: stage
4: second support mechanism
5, 6: lifter pin
7: buffer chamber
11: process chamber
50, 70: gas holes
51, 71: buffer chamber
65: remote plasma source
80, 84: jig
81: support
82: rotation mechanism
83: lifting mechanism
85, 86, 87: magnetic seal
100: controller
GS1: first gas supply source
GS2: second gas supply source
GS3: third gas supply source
SHA, SHB: gas shower head

The invention claimed is:

1. A film forming method comprising:
   preparing a substrate which has at least one layer formed on a front surface thereof;
   measuring a layer thickness of the at least one layer of the substrate, the layer thickness being determined by measuring a height of the at least one layer;
   preparing a mask which has a same shape and a same size as those of the substrate;
   forming one or more holes at one or more portions of the mask corresponding to one or more desired film formation portions on a back surface of the substrate, based on a measurement result of a surface state of the substrate which includes the layer thickness, the measurement result indicating the height of the layer for each horizontal (x, y) coordinate on the substrate, to create the mask having a pattern formed by the one or more holes, the pattern of the mask corresponding to the substrate whose surface state is measured;
   transferring the mask into a process chamber;
   transferring the substrate into the process chamber; and
   forming a film on the back surface of the substrate with the pattern while the mask is disposed onto the back surface of the substrate.

2. The film forming method of claim 1, wherein said transferring the substrate into the process chamber is performed after said transferring the mask into the process chamber.

3. The film forming method of claim 1, wherein the mask, which is prepared based on the measurement result of the surface state of the substrate that is a film formation target, is transferred into the process chamber from a buffer chamber where multiple masks are held, and the film is formed on the back surface of the substrate.

4. The film forming method of claim 1, wherein a storage unit that stores process conditions in association with mask information is referred to transfer a mask corresponding to mask information stored in association with a specific process condition into the process chamber, and the film is formed on the back surface of the substrate.

5. The film forming method of claim 1, wherein a storage unit that stores process conditions in association with mask information is referred to transfer two or more different masks corresponding to mask information stored in association with a specific process condition into the process chamber, and the two or more different masks are simultaneously disposed onto the back surface of the substrate when forming the film on the back surface of the substrate.

6. The film forming method of claim 1, wherein a storage unit that stores process conditions in association with mask information is referred to sequentially transfer two or more different masks corresponding to mask information stored in association with a specific process condition into the process chamber, and
   wherein a film formation is performed on the back surface of the substrate while one of the two or more different masks is disposed onto the back surface of the substrate and, then, the film formation is further performed on the back surface of the substrate while the other masks are sequentially disposed onto the back surface of the substrate.

7. The film forming method of claim 1, wherein the mask is made of a material other than quartz or metal.

8. The film forming method of claim 1, further comprising:
   performing cleaning in a state where the mask is disposed in the process chamber and the substrate is extracted.

9. The film forming method of claim 1, further comprising:
   when forming the film on the back surface of the substrate or cleaning a back surface of the mask, moving the substrate and the mask close to an upper gas shower head formed at a ceiling portion of the process chamber and supplying a purge gas to the front surface of the substrate through the upper gas shower head.

10. The film forming method of claim 1, further comprising:
    when forming the film on the front surface of the substrate, moving the substrate and the mask close to a lower gas shower head formed at a bottom portion of the process chamber and supplying a purge gas to the back surface of the substrate through the lower gas shower head.

* * * * *